United States Patent [19]

Kriedt et al.

[11] 4,277,756
[45] Jul. 7, 1981

[54] AMPLIFIER CIRCUIT ARRANGEMENT FOR APERIODIC SIGNALS

[75] Inventors: Hans Kriedt, Munich; Josef Fenk, Guenzenhausen Ottenburg, both of Fed. Rep. of Germany

[73] Assignee: Siemens Aktiengesellschaft, Berlin & Munich, Fed. Rep. of Germany

[21] Appl. No.: 7,780

[22] Filed: Jan. 30, 1979

[30] Foreign Application Priority Data

Jan. 31, 1978 [DE] Fed. Rep. of Germany ....... 2804064

[51] Int. Cl.³ ............................................. H03F 3/45
[52] U.S. Cl. ................................... 330/261; 330/301; 330/310
[58] Field of Search ..................... 330/70, 71, 73, 252, 330/261, 301, 311, 310

[56] References Cited

U.S. PATENT DOCUMENTS

| 3,689,752 | 9/1972 | Gilbert | 330/252 X |
| 3,760,194 | 9/1973 | Lutz et al. | 330/252 X |
| 4,048,577 | 9/1977 | Shinn | 330/254 |
| 4,146,844 | 3/1979 | Quinn | 330/252 X |

FOREIGN PATENT DOCUMENTS 2209898 9/1973 Fed. Rep. of Germany.

Primary Examiner—James B. Mullins
Attorney, Agent, or Firm—Hill, Van Santen, Steadman, Chiara & Simpson

[57] ABSTRACT

Amplifier for aperiodic signals with a base-coupled and an emitter-coupled differential amplification stage in which the emitters and the bases of the two differential amplification stages respectively form an input of which one can be charged with a signal and the respectively other one is capacitively grounded; a third input lies at the directly coupled emitters of the emitter-coupled differential amplification stage; the collectors of both differential amplification stages are cross-coupled; the bases of the base-coupled differential amplification stage is connected to supply potential with a series resistor; static dc currents are fed into the inputs so that a current of the same magnitude flows over the inputs at the bases and emitters of the differential amplification stages and a current of double magnitude flows over the third input.

2 Claims, 2 Drawing Figures

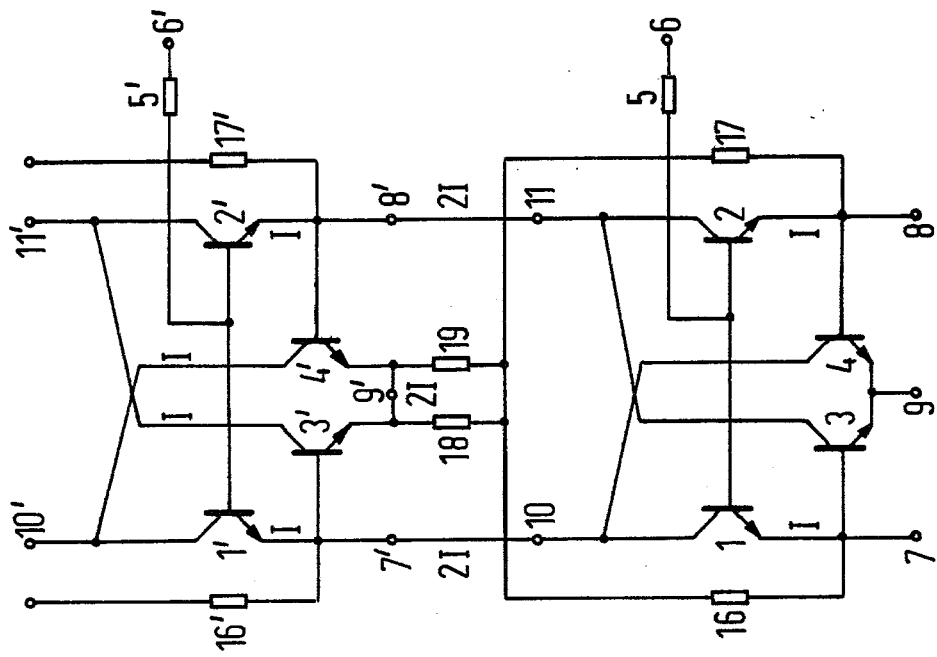
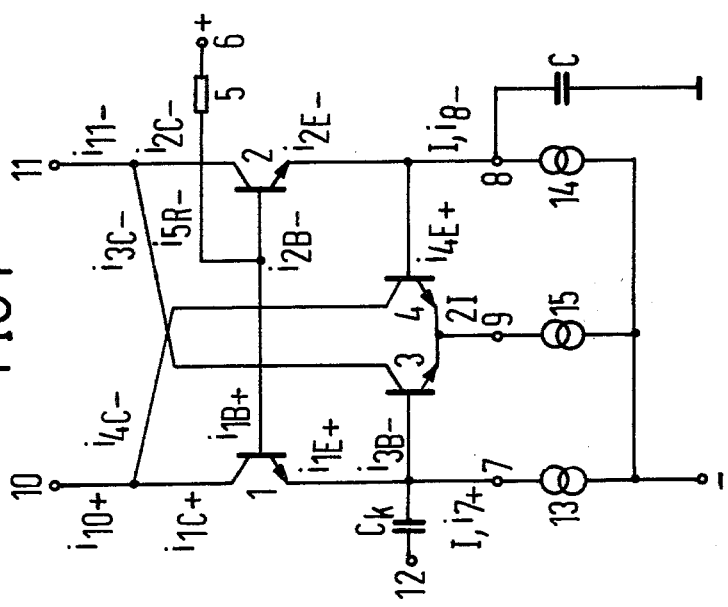

AMPLIFIER CIRCUIT ARRANGEMENT FOR APERIODIC SIGNALS

INTRODUCTION

The present invention relates to an amplifier circuit arrangement for aperiodic signals with a base-coupled differential amplification stage in which two transistors are directly coupled between their bases, and in which the emitters of these transistors form two inputs. Thus, a signal can be fed into one of the inputs and the other input is capacitively connected to a reference potential. Output signals can be tapped at the collectors of the transistors.

An amplifier circuit of the aforementioned type has become known from the German Offenlegungsschrift No. 2,209,889. Because of the capacitive coupling of one of the inputs of such an amplifier circuit arrangement to a reference potential, an aperiodic signal can be coupled in at the other input, whereby of necessity a certain balancing of the output signals available at the collectors is obtained. However, in frequencies in the VHF and UHF range, because of the base and emitter resistances present in every real transistor, the coupling is not ideally realized, so that a noticeable amount of phase and amplitude difference can still be determined in the symmetrical output signals.

BRIEF SUMMARY OF THE INVENTION

The object of the present invention is to provide an amplifier circuit arrangement of the type in question in which a balancing of the output signals available at the outputs is possible with significantly reduced amount of phase and amplitude differences. In an amplifier circuit arrangement of the type initially cited, this object is achieved by means of the following features:

A further emitter-coupled differential amplification stage with two transistors whose emitters are directly coupled and lie at a third input and whose bases are respectively coupled to an input at the emitter of the transistors of the base-coupled differential amplification stage, and whose collectors are cross-coupled with the collectors of the transistors of the base-coupled differential amplification stages.

A coupling of the bases of the transistors of the base-coupled differential amplification stage to a post for a supply potential is provided.

An impression of dc currents in the inputs is made in such a manner that a current of equal magnitude flows in the inputs lying at the emitters of the transistors of the base-coupled differential amplification stage and the bases of the transistors of the emitter-coupled differential amplification stage and a current of double magnitude flows via the third input at the emitters of the transistors of the emitter-coupled differential amplification stage.

BRIEF DESCRIPTION OF THE DRAWINGS

In the following, the invention is explained in greater detail on the basis of embodiments illustrated in the Figures. of the drawings.

FIG. 1 illustrates an embodiment of an inventive amplifier circuit arrangement; and FIG. 2 illustrates a cascade circuit arrangement of two amplifier circuit arrangements according to FIG. 1.

DESCRIPTION OF THE PREFERRED EMBODIMENTS

The amplifier circuit arrangement illustrated in FIG. 1 includes a base-coupled differential amplification stage with two transistors 1 and 2 whose bases are directly coupled to one another; whose emitters lie at an input 7 or at an input 8, respectively; and whose collectors lie at an output 10 or at an output 11, respectively. This amplifier circuit arrangement further contains an emitter-coupled differential amplification stage with two transistors 3 and 4 whose emitters are directly coupled with one another, whose bases lie at input 7 or at input 8, respectively, and whose collectors are cross-coupled with the collectors of the transistors 1 and 2 of the base-coupled differential amplification stage. In the illustrated sample embodiment, an alternating use signal to be amplified can be fed in the input 7 via a coupling capacitance $C_k$ at a post 12, whereas the input 8 is grounded via a capacitance C. The juncture of the emitters of the transistors 3 and 4 of the emitter-coupled differential amplification stage is connected to an input 9.

A positive supply potential is supplied to the bases of the transistors 1 and 2 coupled directly with one another from a post 6 via an ohmic resistance 5. Further, static dc currents are fed into the amplifier circuit arrangement at the inputs 7, 8 and 9 via current sources 13, 14 and 15, whereby a current of the value I flows into the inputs 7 and 8 and a current of doubled value 2I flows into the input 9. In a design with npn-transistors, these currents are drawn from a negative potential.

If one assumes that an input alternating current of the magnitude $i_{7+}$ is additionally fed into the input 7 whereas only the dc current of the magnitude I flows into the input 8 for the case of unsymmetrical feeding, then the currents I and $i_{7+}$ flowing into the input 7 are respectively divided into two portions which flow into the emitter of the transistor 1 and the base of the transistor 3. An alternating current which is possible because of the coupling of the transistors is short-circuited to ground at input 8 via the capacitance C. The input alternating current $i_{7+}$ at input 7 is divided into an emitter current $I_{1E+}$ for the transistor 1 and a base current $i_{3B-}$ for the transistor 3. Because of the emitter current in transistor 1, a base current $i_{1B+}$ arises in this transistor which is divided into a current $i_{5R-}$ flowing through the resistor 5 and a base current $i_{2B-}$ of the transistor 2. The latter control current $i_{2B-}$ generates a collector current in transistor 2 of the magnitude $\beta \cdot i_{2B-} = i_{2C-} = \alpha \cdot i_{2E-}$, wherein $\alpha$ and $\beta$ indicate the current amplification factors of the transistor 2, and $i_{2E-}$ indicates the emitter current of the transistor 2. The amount of this collector current $i_{2C-}$, however, is smaller than the collector current $i_{1C+} = \alpha \cdot i_{1E+}$ of transistor 1. Because of the dynamic impedance of transistor 1 a control signal with low generator impedance arises at the base of transistor 3, because of the transconductance of the transistor stage 3 and 4 this control signal generates a collector current $i_{3C-}$ in transistor 3 whose amount corresponds to the magnitude of $i_{1C+}$ for the case in which the dc current at input 9 has the value 2 I. The controlling effect of the emitter current $i_{3E-}$ generates an emitter current $i_{4E+}$ in transistor 4, whereby a collector current $i_{4C+} = \alpha \cdot i_{4E+}$ arises in transistor 4 whose amount is likewise smaller than the collector current $i_{1C+}$ of transistor 1. At output 10, therefore, a sum current $i_{10+} = i_{1C+} + i_{4C+}$ arises at input 10 and, analogously, at output 11 a sum current $i_{11-} = i_{2C-} + i_{3C-}$, whose amount is equal to the amount of the current $i_{10+}$. These currents approximately have the double value of the input current $i_{7+}$. Moreover, an output dc current of the magnitude 2I respectively flows in the outputs 10 and 11.

The advantages of the amplifier circuit arrangement described above are to be seen therein that the lower activation of transistors 2 and 4 conditioned by means of the unsymmetrical activation is compensated by means of the cross-wise coupled collectors of all transistors. The influence of the parasitic collector-base capacitances occurs both in the base-coupled differential amplification stage with the transistors 1 and 2 as well as in the emitter-coupled differential amplification stage with the transistor 3 and 4 by means of the low-resistance dynamic impedance of the emitters of the transistors 1 and 2, however, only more negligibly. The influence of the parasitic collector-base return current in transistor 1 and 2 is low, because these currents are fed in at the base in antiphase and compensate one another; thus, a phantom mass point arises.

If, according to FIG. 2, in which similar elements as in the circuit arrangement according to FIG. 1 are provided with the same reference numbers, a plurality of amplifier circuit arrangements according to FIG. 1 are switched in cascade, whereby the outputs 10 and 11 of a first amplifier circuit arrangement are switched together with inputs 7' and 8' of a succeeding amplifier circuit arrangement, then the dc current rises by the factor 2 from amplifier to amplifier. For this reason, the input impedance is respectively smaller by the factor 2. The voltage amplification of all amplifiers—up to the last amplifier loaded with a (not illustrated) ohmic resistance—is then approximately equal to one. Because of the low input impedance of a succeeding amplifier, the influence of parasitic capacitances becomes noticeable only in the proximity of the limiting frequency.

If a circuit arrangement according to FIG. 2 is wired with further resistance 16, 17, 18 and 19, whereby one resistance branch 16, 18 is conducted from input 7 and one resistor branch 17, 19 is conducted from input 8 of the preceding amplifier to the input 9' of the succeeding amplifier, then it is possible to operate each amplifier with the same current. By means of a corresponding selection of the supply voltages at the posts 6 and 6' as well as of the values for the resistances 16, 17, 18 and 19, which are preferably large in comparison to the input impedances, the influence of these resistances on the frequency response of the amplification can be held to a minimum.

Circuit arrangements of the type described above can be executed in an advantageous manner as integrated circuits, whereby the low frequency dependency guarantees the widest application possibilities in wide band amplifiers. They can be built up with bipolar transistors as well as with field effect transistors. For field effect transistors, the terms emitter, collector and base of the bipolar transistors are to be analogously replaced by source, drain and gate.

It will be apparent to those skilled in the art that many modifications and variations may be effected without departing from the spirit and scope of the novel concepts of the present invention.

We claim as our invention:

1. Amplifier circuit arrangement for aperiodic signals with a base-coupled differential amplifier stage in which two transistors are directly coupled with their bases, in which the emitters of the transistors form two inputs, whereby a signal can be fed into one of the inputs and the respectively other input is capacitively applied to reference potential, and in which output signals can be topped at the collectors of the transistors, comprising a further emitter-coupled differential amplifier stage with two transistors whose emitters are directly coupled and lie at a third input, their bases being respectively coupled to an input at the emitters of the transistors of the base-coupled differential amplifier stage and their collectors being cross-coupled to the collectors of the transistors of the base-coupled differential amplifier stage, and comprising such an impression of quiescent direct currents into the inputs that a current of identical size flows in the inputs lying at the emitters of the transistors of the base-coupled differential amplifier stage and the bases of the transistors of the emitter-coupled differential amplifier stage and a current of twice this size flows across the third input at the emitters of the transistors of the emitter-coupled differential amplifier stage, characterized in that the directly coupled bases of the transistors of the base-coupled differential amplifier stage are coupled via a resistor to a post for a supply potential.

2. Amplifier circuit arrangement according to claim 1 with a cascade circuit of a plurality of amplifiers due to coupling the outputs of a preceding amplifier to the inputs of the following amplifier lying at the emitters of the transistors of the base-coupled differential amplifier stage and the bases of the transistors of the emitter-coupled differential amplifier stage, the direct coupled bases of the base-coupled differential amplifier stages being coupled via a respective resistor to a respective post for a supply potential.

* * * * *